United States Patent
Wu (12) 
(10) Patent No.: US 6,329,859 B1
(45) Date of Patent: Dec. 11, 2001

(54) N-WAY CIRCULAR PHASE INTERPOLATOR FOR GENERATING A SIGNAL HAVING ARBITRARY PHASE

(75) Inventor: Bin Wu, San Jose, CA (US)

(73) Assignee: BitBlitz Communications, Inc., Fremont, CA (US)

( * ) Notice: Subject to any disclaimer, the term of this patent is extended or adjusted under 35 U.S.C. 154(b) by 0 days.

(21) Appl. No.: 09/535,270

(22) Filed: Mar. 23, 2000

(51) Int. Cl.[7] ........................................ G06F 1/04

(52) U.S. Cl. ..................... 327/291; 116/246; 116/274

(58) Field of Search ........................... 327/116, 119–122, 327/237, 246, 250, 291, 295, 270, 271, 274, 276, 277, 278

(56) References Cited

U.S. PATENT DOCUMENTS

| | | | |
|---|---|---|---|
| 5,777,501 | * | 8/2000 | Abouseido ........................... 327/274 |
| 5,945,863 | * | 8/1999 | Coy ...................................... 327/280 |
| 6,005,448 | * | 12/1999 | Pickering et al. .................. 327/280 |
| 6,107,848 | * | 8/2000 | Pickering et al. .................. 327/146 |

* cited by examiner

Primary Examiner—Kenneth B. Wells
(74) Attorney, Agent, or Firm—Skjerven Morrill MacPherson LLP; Edward C. Kwok (57) ABSTRACT

An N-way Circular Phase Interpolator interpolates the N phases of a reference clock signal to generate a tunable clock. By using more than two phases for interpolation, high excess frequencies as well as high precision (i.e. small jitter) are achieved. The N-way Circular Phase Interpolator provides for analog filtering in the phase domain, which attenuates the out-of-band phase noises thus further reducing the output jitter.

24 Claims, 8 Drawing Sheets

Figure 1

Prior Art

Figure 2

Prior Art

Figure 3

*prior Art*

Figure 4

Prior Art

N-WAY CIRCULAR PHASE INTERPOLATOR FOR GENERATING A SIGNAL HAVING ARBITRARY PHASE

FIELD OF INVENTION

The present invention relates to generation of clock signals in electronic circuits, and more particularly, to generation of clock signals having externally tunable phase and frequency.

DESCRIPTION OF THE RELATED ART

Many electronic systems, such as communication systems, require clock signals whose phase and frequency can be tuned externally. One such system is the Clock and Data Recovery (CDR) circuit. A CDR circuit recovers the embedded clock from a baseband non-return-to-zero (NRZ) or return-to-zero (RZ) data stream and generates a clean data stream (e.g., data that does not have timing jitter due to e.g. the limited bandwidth of the transmission channel). The clock recovery function of a CDR is typically performed with a Phase-Locked Loop (PLL) which requires a tunable clock signal, such as that generated by a Voltage-Controlled Oscillator (VCO).

However, VCOs are generally susceptible to noise, supply voltage, process parameter and temperature variations. Therefore, VCOs and PLLs incorporating VCOs exhibit undesirable characteristics when they are used, for example, in mixed-signal Integrated Circuits (ICs).

One well known class of circuits that reduces the above problems is the Delay-Locked Loop (DLLs). A DLL generates a clock signal that has the same frequency as that of a reference clock signal but whose phase may deviate from that of the reference clock by an amount that is within a pre-defined range.

However, many systems require plesiochronous clocks, i.e. clocks whose frequencies vary within a small range centered around a nominal value. For example, the 1000Base-X versions of the Gigabit Ethernet standard require a bit-rate deviation of less than 100 parts per million from the nominal bit rate of 1.25 Giga-bit per second. Such plesiochronous clocks cannot be generated by using DLLs.

Figure 1:
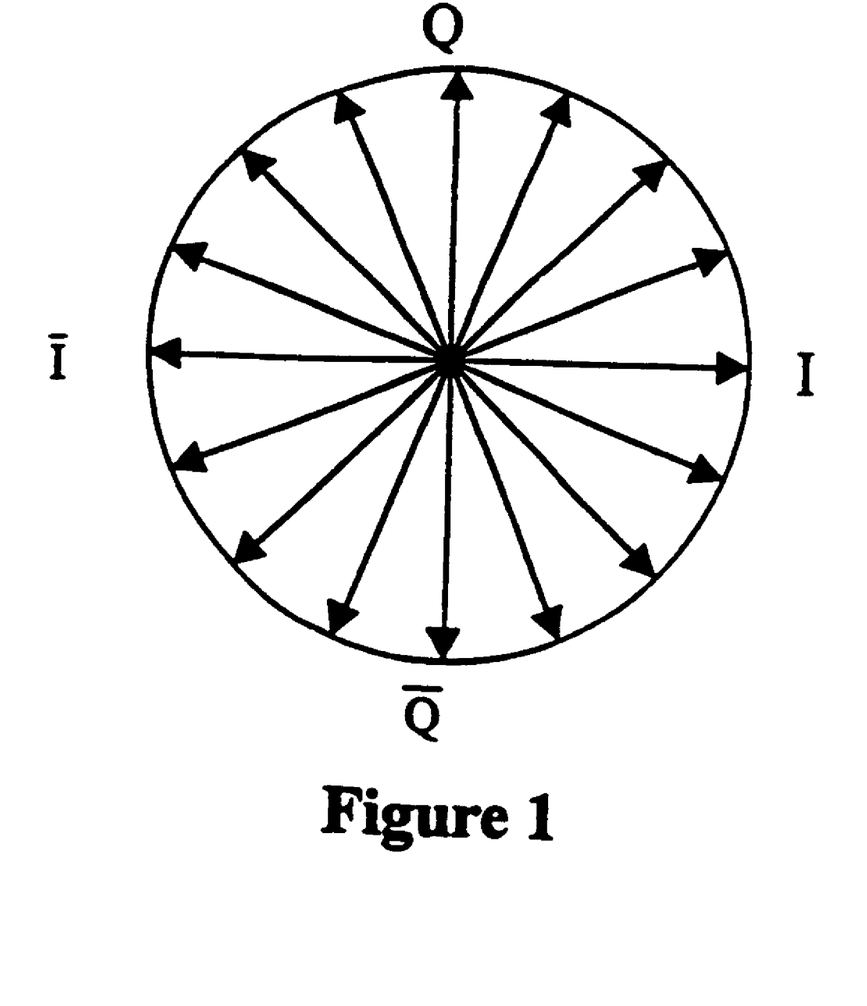
FIG. 1 shows 16 phasors equally spaced along the $2\pi$ phase of a reference clock.

One known method for generating a tunable plesiochronous clock signal is "phase picking". According to this technique, a number of evenly spaced phases of a reference clock signal are first generated (e.g., 16 as shown in FIG. 1). The multiple phases required for this technique could be obtained, for example, by tapping a multi-stage ring oscillator (see *IEEE Journal of Solid State Circuits*, Vol. 25, No. 6, December 1990 "30-*Mhz Hybrid Analog/Digital Clock Recovery Circuit in 2-µm CMOS* by Beomsup Kim, David N. Helma, and Paul R. Gray"; and *IEEE Journal of Solid State Circuits*, Vol. 31, No. 12, December 1996 "*A 0.8 µm CMOS 2.5 Gb/s oversampling Receiver and Transmitter for Serial Lines*" by Chih-Kong Ken Yang and Mark A. Horowitz"). Subsequently, the tuned clock signal is generated by dynamically tapping a particular phase.

In the phase picking technique, the frequency of the generated clock signal may be different from that of the reference clock signal. If the selected tap moves counterclockwise, the frequency of the generated clock signal increases over that of the reference clock. If, on the other hand, the selected tap moves clockwise, the frequency of the generated clock signal becomes lower than that of the reference clock.

Often, the phase selection occurs at a lower rate than the frequency of the reference clock. Furthermore, it takes many updates to achieve an excess phase (i.e., the difference between the phase of the generated clock and that of the reference clock) of $2\pi$. Consequently, the excess frequency (i.e., the difference between the frequency of the generated clock and that of the reference clock) generated as a result of the movement of the tapped phase is usually small compared to the reference clock frequency, making the phase-picking technique suitable for use in a plesiochronous environment. However, because it is difficult to obtain and distribute many phases of a clock signal, the phase picking technique does not lend itself to fine tuning of phase control.

Figure 2:
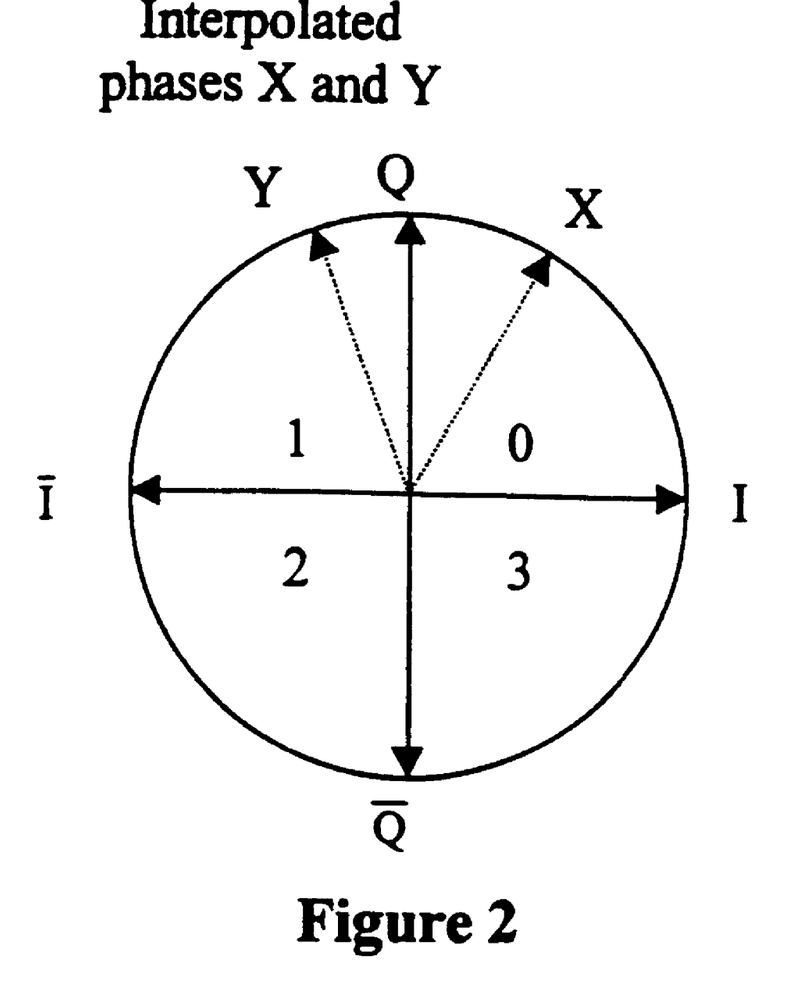
FIG. 2 shows the four major phases used to interpolate the phase of a generated signal, as known in the prior art.

One well known technique for overcoming the above-mentioned problems associated with the phase picking is the Circular Phase Interpolation (CPI) (see ISSCC Dig. Tech. Papers, pp. 160–161, February 1993, "*PLL design for a 500 MB/s Interface*" by M. Horowitz, et al.). FIG. 2 illustrates the four phases, namely I, Q, $\bar{I}$ and $\bar{Q}$, which the CPI uses to generate a signal which has the desired phase. As seen from FIG. 2, the four shown phases are 90° apart. According to the CPI technique, the phase of any vector is a weighted sum of two of the above four phases. For example, the phase of vector X is a weighted sum of phases I and Q. Similarly, the phase of vector Y is a weighted sum of phases Q and $\bar{I}$. Consequently, by selecting the proper weights, a signal whose phase is a weighted sum of the above phases is obtained.

Figure 3:
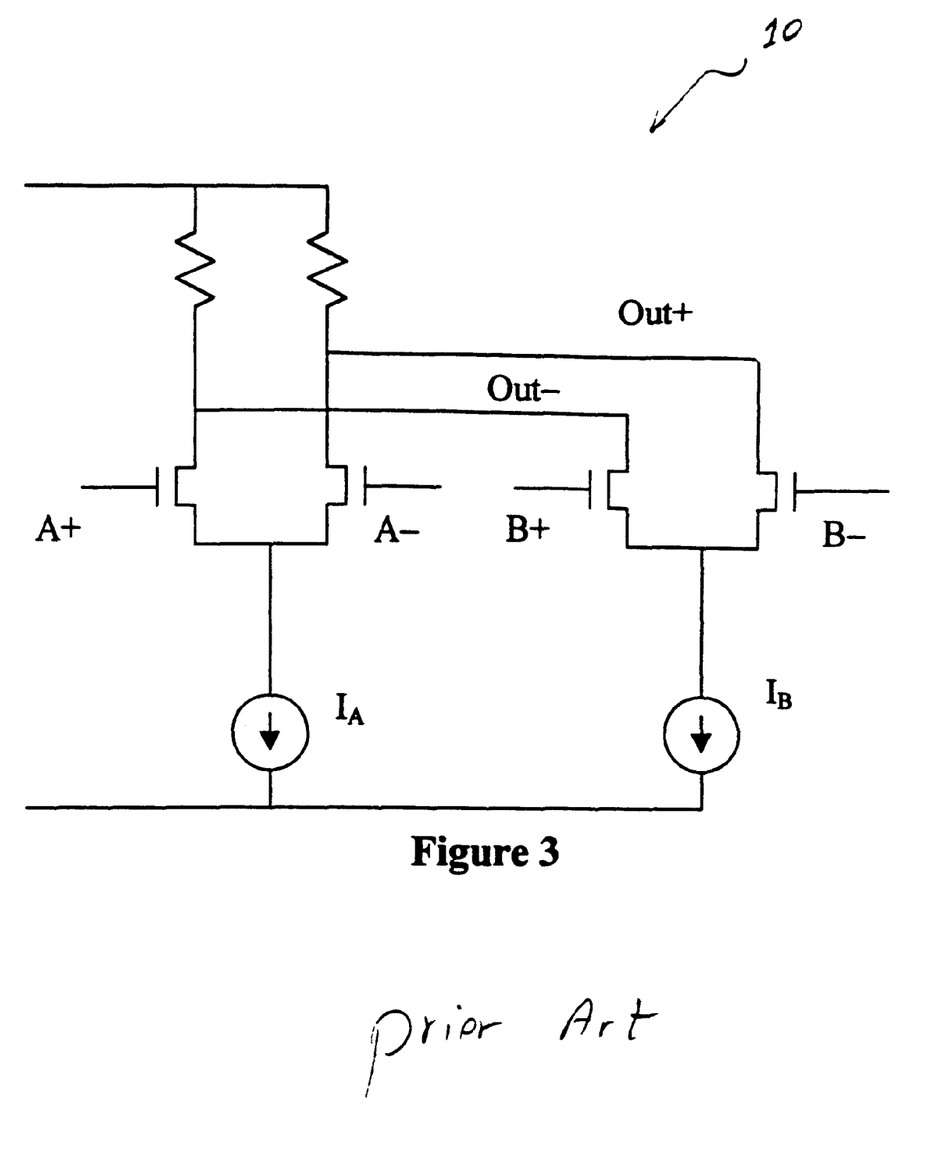
FIG. 3 shows a schematic view of a two-way linear phase interpolator, as known in the prior art.

FIG. 3 shows a known Linear Phase Interpolator (LPI) 10 for linearly interpolating signals A and B, which are respectively represented by a pair of differential signals $A^+$, $A^-$ and $B^+$, $B^-$. In FIG. 3, output signal OUT is represented by differential signals $OUT^+$ and $OUT^-$. As seen from FIG. 3, LPI 10 applies weight signals $I_A$ and $I_B$ respectively to signals A and B to generate signal OUT. Phases $\theta_A$, $\theta_B$ and $\theta_{OUT}$, which are respectively represented by signals A, B, and OUT, are approximately linearly related, as shown below in equation (1):

$$\theta_{OUT} = \theta_{fix} + \theta_A \times \frac{I_A}{I_O} + \theta_B \times \frac{I_B}{I_O} \qquad (1)$$

where $I_o = I_A + I_B$.

Figure 4:
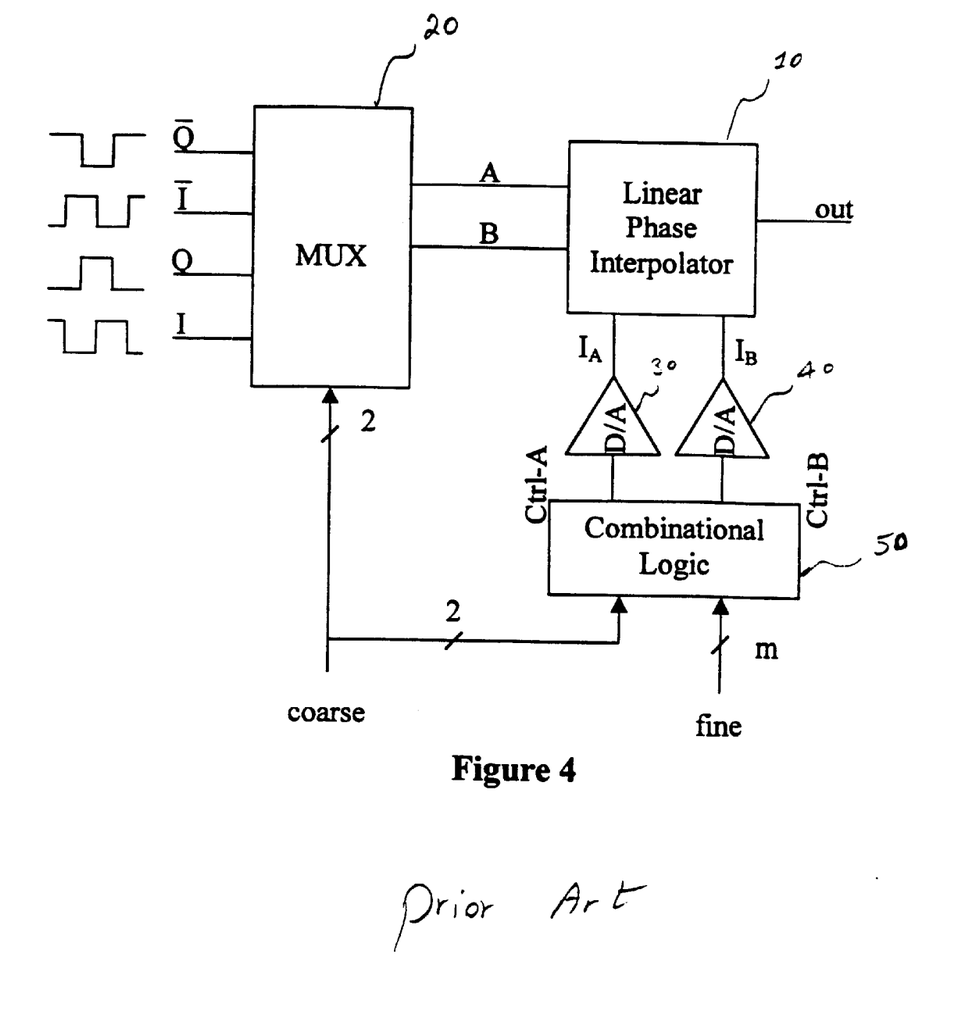
FIG. 4 shows a block diagram of a Circular Phase Interpolator employing four major phases and incorporating the linear phase interpolator of FIG. 3, as known in the prior art.

FIG. 4 shows a four phase CPI circuit 100. CPI 100 includes LPI 10 (also shown in FIG. 3), multiplexer (MUX) 20, Digital-to-analog (D-to-A) converters 30, 40, and combinational logic 50. Combinational logic 50 receives a digital control word consisting of 2+m bits. The two most significant bits (MSB) of the control word select from among the four phase signals I, Q, $\bar{I}$, $\bar{Q}$. The remaining m bits of the control word are applied to D-to-A converters 30 and 40 which convert the m bits into analog currents $I_A$ and $I_B$, representing the weights applied to the selected phases. Accordingly, the least significant bit (LSB) (i.e., the smallest phase step) corresponds to a phase $2\pi/2^{2+m}$. MUX 20 receives the MSBs to select and thereby supply to LPI 10 the two signals A and B used for generating signal OUT. Note that a $2\pi$ phase, in radian units, is equivalent to a 360° phase, in degree units.

CPI 100 of FIG. 4 typically operates under the "unitary update" rule, which requires that each new digital control word differ from the previous one by either 0 or ±1 LSB in order to prevent glitches at the generated phase. In CPI 100, when the generated phase moves from point X to point Y (see FIG. 2), the generated phase must cross phase Q. To provide the proper phase, input phase, signal I is blocked from reaching the output terminal of MUX 20; instead, input phase signal I is delivered to the output terminal of MUX 20. Consequently, unless the weight applied to phase signal I is zero at the time of the input transition, a glitch appears at the generated signal OUT. To prevent the glitch from appearing, the unitary update rule must be met.

In order to reduce quantization error, which causes jitter in the phase, and to increase precision, smaller one-LSB steps are required. To achieve smaller steps, either one of the following techniques may be used: 1) increase the number of phase signals (i.e., phase signals I, Ī, etc., which constitute the coarse phases); 2) add more bits to the interpolative control signal (i.e., add more bits to the m-bit interpolative control signal FINE of FIG. 4). However, both of the above techniques increase system complexity and power consumption. In addition, adding more bits for interpolative control places more stringent linearity requirements on the D-to-A converters 30, 40 and linear phase interpolator 10. Moreover, as more bits are added to the control word to increase precision, because of the unitary update rule, a $2\pi$ phase rotation takes longer to complete, thereby affecting the speed of CPI 100. Therefore, CPI 100 suffers from a trade-off between precision and speed of operation.

Therefore, both phase picking and circular phase interpolation techniques have limitations that restrict their use in many applications.

SUMMARY

An N-way Circular Phase Interpolator (CPI), in accordance with one embodiment of the present invention, generates a signal having the desired phase by generating a weighted sum of N phases of a reference clock.

In a three-way CPI (i.e., N is equal to 3), e.g. six phases of a reference clock are used to generate the desired phase. In other words, the three-way CPI divides the $2\pi$ phase of a reference clock into e.g. 6 equal phases of 0°, 60°, 120°, 180°, 240° and 300°, thereby creating 6 major phase regions. Each of the six major phase regions is further divided into two sub-regions thereby creating a total of 12 sub-regions.

To interpolate a phase, the CPI applies a weight to each of three phases in a phase group. The first and second of these phases form the phase region encompassing the interpolated phase. The third phase in the group is the nearest-neighbor phase to either the first phase or the second phase in the group.

Because only the first two phases in each phase group are used for interpolation, the weight associated with the third phase is zero. As the phase of the generated signal moves from one sub-region to the other sub-region within the same major phase region, the third phase changes from being the nearest-neighbor phase to the first phase in the group to the nearest-neighbor phase to the second phase in the group while maintaining a zero weight. When the generated phase eventually crosses the boundary of a major phase region, the three phases used for interpolation remain the same; however, the respective weights applied to the three phases change, thereby preventing glitches at the generated phase.

The three-way CPI employs a number of digital-to-analog signal converters to receive m bits, representing the weights applied to each phase in a group of three phases, and supplies the converted analog signals to low-pass analog filters. The analog filters apply the low-pass filtered weights to a linear phase interpolator (LPI). The LPI, in addition to receiving the low-pass filtered analog weights, also receives the three phase signals in a selected phase group and generates a weighted sum of the phase signals to determine the phase of the generated signal.

Advantageously, the three-way CPI is not limited by the unitary update rule and achieves faster phase changes.

The three-way CPI includes a multiplexer and a combinational logic circuit to implement the required logic functions of the CPI.

In a four-way CPI (i.e., N is equal to 4), e.g. eight phases of a reference clock are used to generate the desired phase. In other words, the four-way CPI divides the $2\pi$ phase of a reference clock into e.g. 8 equal phases of 0°, 45°, 93°, 135°, 180°, 225°, 270° and 315° to thereby generate the required phase.

DETAILED DESCRIPTION

Figure 5:
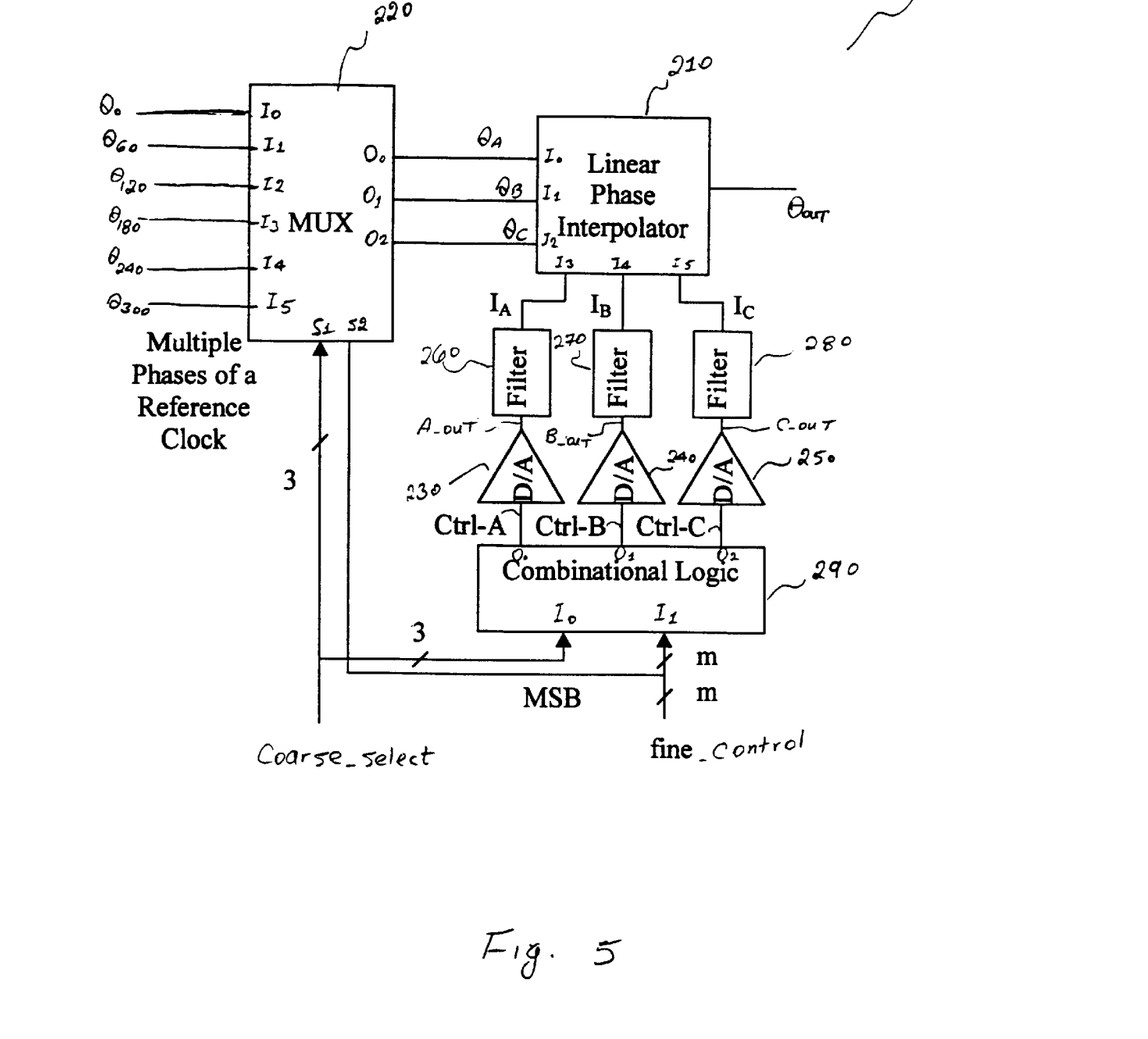
FIG. 5 shows a three-way circular phase interpolator, in accordance with one embodiment of the present invention.

FIG. 5 shows a three-way circular phase interpolator 200, in accordance with one embodiment of the present invention.

Three-way circular phase interpolator 200 includes linear phase interpolator (LPI) 210, multiplexer (MUX) 220, Digital-to-analog (D-to-A) converters 230, 240, 250, analog filters 260, 270, 280, and combinational logic 290.

MUX 220 receives the three-bit signal COARSE_SELECT and the most significant bit of the m-bit signal FINE_CONTROL at its input select terminals S1 and S2 respectively. The six signals $\theta_0$, $\theta_{60}$, $\theta_{120}$, $\theta_{180}$, $\theta_{240}$ and $\theta_{300}$ (hereinafter phase signals) are respectively 0°, 60°, 120°, 180°, 240° and 300° phase-shifted replicas of the reference clock.

Although in the description below of three-way circular phase interpolator 200, the $2\pi$ phase is divided into six equal 60° phases, it is understood that the $2\pi$ phase may be divided into any integer numbers of phases (e.g., 8).

Phase signals $\theta_0$, $\theta_{60}$, $\theta_{120}$, $\theta_{180}$, $\theta_{240}$ and $\theta_{300}$ are respectively applied to input pins $I_0$–$I_5$ of MUX 220 and each carry a pair of differential signals (not shown and commonly referred to in the context of differential signals as a plus and a minus signal). For example phase signal $\theta_0$ includes signals $\theta^+_0$ and $\theta^-_0$, which are differential. In some embodiments, if the voltage supply to CPI 200 is 5 volts, signals $\theta^+_0$ and $\theta^-_0$ may vary between 2 to 3 volts. In addition, when one of the differential signals (e.g., $\theta^+_0$) is at a high level (e.g., 3 volts), the other differential signal (e.g., $\theta^-_0$) is at a low level (e.g., 2 volts). Accordingly, LPI 210 of CPI 200 receives a pair of signals (not shown) for each of the phase signals $\theta_A$, $\theta_B$, and $\theta_C$.

MUX 220 has three output terminals $O_0$, $O_1$ and $O_2$. Depending on the value of the control signals applied to input terminals S1 and S2, three of the six phase signals are supplied to output terminals $O_0$, $O_1$, and $O_2$ of MUX 220. The output signals of MUX 220, namely phase signals $\theta_A$, $\theta_B$ and $\theta_C$ are respectively applied to input terminals $I_0$, $I_1$ and $I_2$ of LPI 210.

Combinational logic circuit 290 receives a digital control word CTRL (not shown) consisting of the three-bit signal COARSE_SELECT and the m-bit signal FINE_CONTROL. Combinational logic 290 generates digital signals CTRL_A, CTRL_B and CTRL_C at its output terminals $O_0$, $O_1$ and $O_2$. The three bits of signal COARSE_SELECT form the most significant bits of the digital control word CTRL and the m bits of signal FINE_CONTROL form the least significant bits of the digital control word CTRL.

Digital signals CTRL_A, CTRL_B and CTRL_C—each of which have m bits (e.g. m may be equal to 6 in some embodiments)—are respectively converted to analog signals A_OUT, B_OUT and C__C_OUT by D-to-A converters 230, 240 and 250. Signals A_OUT, B_OUT and C_OUT are respectively applied to low-pass filters 260, 270 and 280, each of which respectively passes the low frequency part of the signals applied thereto and, in response, generate signals $I_A$, $I_B$ and $I_C$. Signals $I_A$, $I_B$ and $I_C$ are the low-pass filtered analog weight signals which are respectively applied to input terminals $I_3$, $I_4$ and $I_5$ of linear phase interpolator 210.

Figure 6:
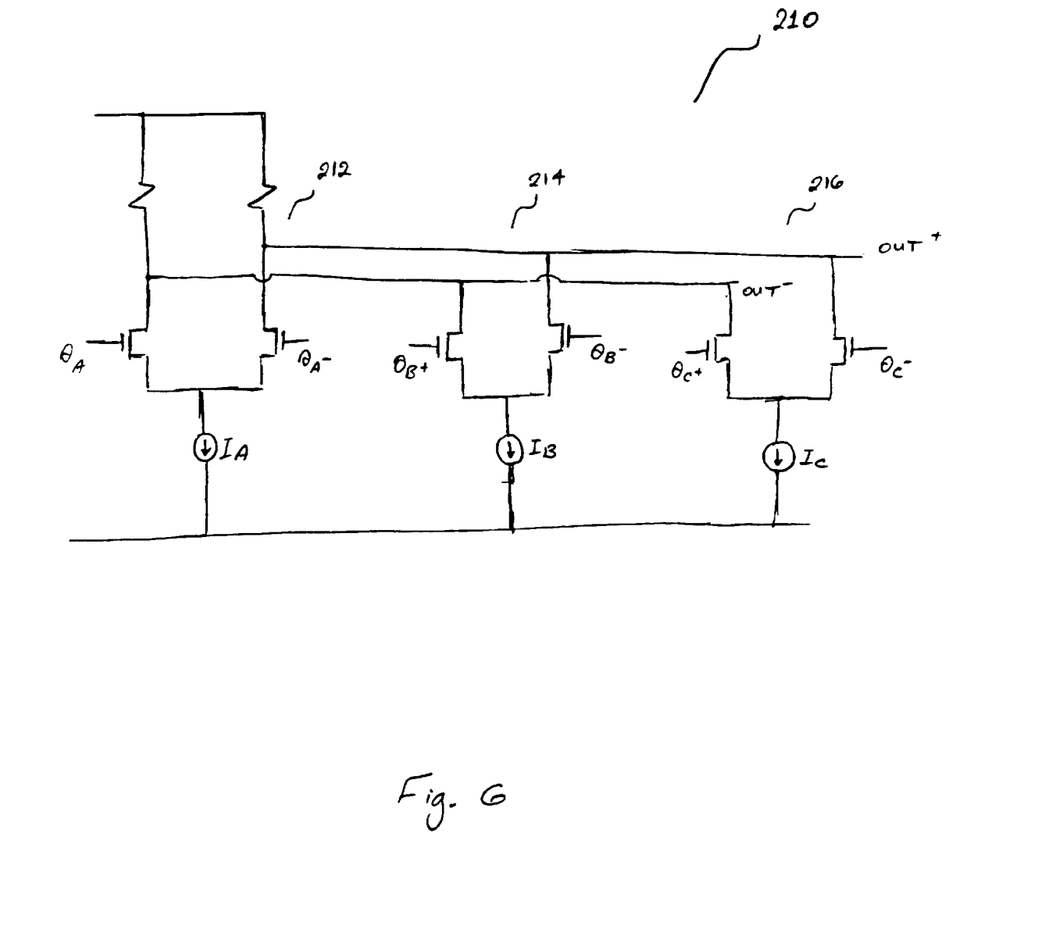
FIG. 6 shows a schematic view of the linear phase interpolator of the three-way circular phase interpolator of FIG. 5.

FIG. 6 shows a schematic circuit of LPI 210. LPI 210 includes three differential stages 212, 214 and 216. Differential stage 212 receives signal $\theta_A$ (which includes differential signals $\theta_A^+$ and $\theta_A^-$) from MUX 220 and signal $I_A$ from filter 260. Differential stage 214 receives signal $\theta_B$ (which includes differential signals $\theta_B^+$ and $\theta_B^-$) from MUX 220 and signal $I_B$ from filter 270. Differential stage 216 receives signal $\theta_C$ (which includes differential signals $\theta_B^+$ and $\theta_B^-$) from MUX 220 and signal $I_C$ from filter 280. LPJ 210 generates signal $\theta_{OUT}$ which is also the output signal of the CPI 200. The operation of CPI 200 is described next.

Figure 7:
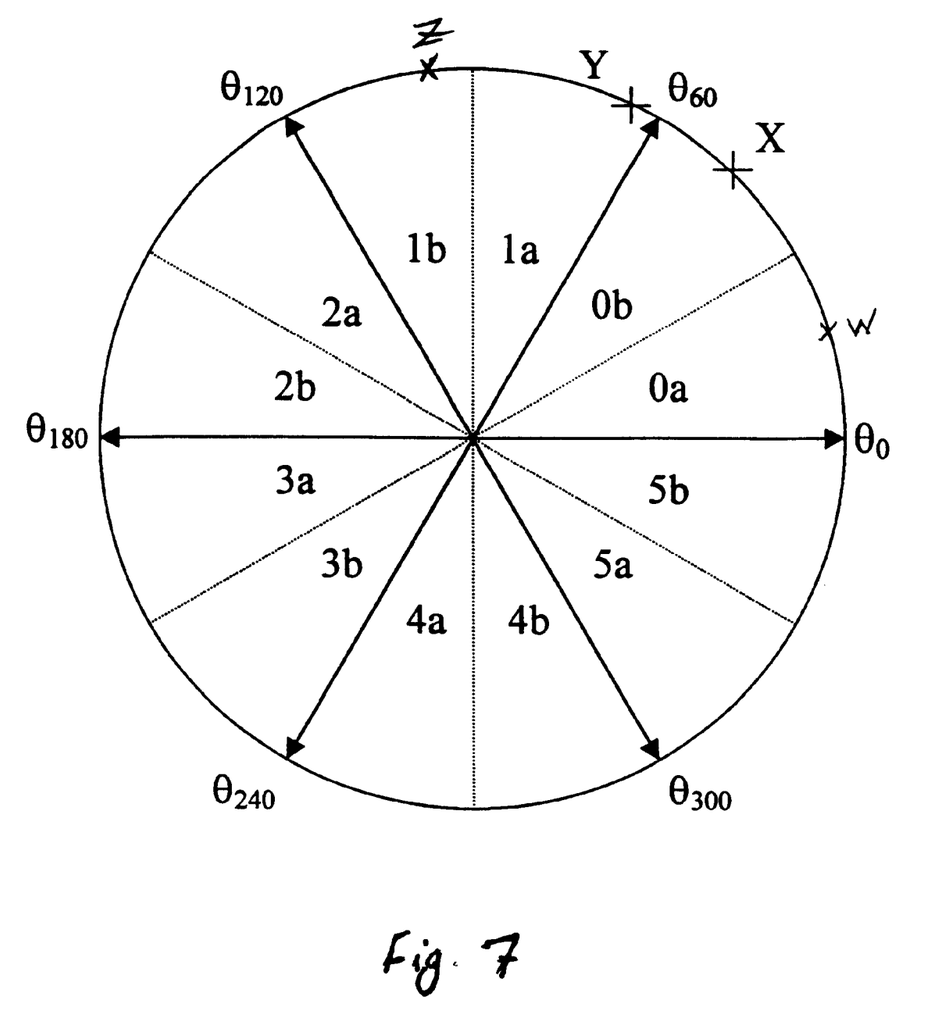
FIG. 7 shows the six major phases and the 12 sub-regions used in the three-way circular phase interpolator of FIG. 5.

FIG. 7 is a phasor diagram of the six phases $\theta_0$, $\theta_{60}$, $\theta_{120}$, $\theta_{180}$, $\theta_{240}$ and $\theta_{300}$ of the reference clock as applied to MUX 220 of FIG. 5. As seen in FIG. 7, the $2\pi$ phase is divided into 12 equal phase regions, each covering a 30° phase range. Starting from phase $\theta_0$ and moving in the counter clock-wise direction, these regions are: 0a, 0b, 1a, 1b, 2a, 2b, 3a, 3b, 4a, 4b, 5a and 5b. Therefore, a phasor in region 0a, has a phase between 0° to 30°. Similarly, a phasor in region 3b has a phase between 210° and 240°.

Referring to FIG. 5, the phase signal $\theta_{OUT}$ generated by LPI 210 is approximately equal to:

$$\theta_{OUT} = \theta_{fix} + \theta_A \times \frac{I_A}{I_O} + \theta_B \times \frac{I_B}{I_O} + \theta_C \times \frac{I_C}{I_O} \quad (1)$$

where $\theta_{fix}$ is a fixed phase delay and $I_O = I_A + I_B + I_C$

As seen in equation (1), in accordance with the present invention, phase signal $\theta_{OUT}$ is proportional to a weighted sum of the phase signals $\theta_A$, $\theta_B$, $\theta_C$. The weight applied to each of the phase signals $\theta_A$, $\theta_B$, $\theta_C$ is respectively equal to $$\frac{I_A}{I_O}, \frac{I_B}{I_O}, \frac{I_C}{I_O}.$$

Advantageously, as shown below, the linearly interpolated phase signal $\theta_{OUT}$ is immune to glitches as phase signal $\theta_{OUT}$ moves past any of the six phase signals $\theta_0$, $\theta_{60}$, $\theta_{120}$, $\theta_{180}$, $\theta_{240}$ and $\theta_{300}$.

The analog filtered signals $I_A$, $I_B$ and $I_C$ are related to their respective digital signals CTRL_A, CTRL_B and CTRL_C by the following equations:

$$I_A = \text{CTRL\_A} \times \frac{I_O}{N} \otimes h(t) \quad (2)$$

$$I_B = \text{CTRL\_B} \times \frac{I_O}{N} \otimes h(t)$$

$$I_C = \text{CTRL\_C} \times \frac{I_O}{N} \otimes h(t)$$

In equation (2), notation "$\otimes$" represents the well-known convolution operation. N is equal to $2^m$, where m is the number of bits in signal FINE_CONTROL applied to input terminal $I_1$ of combinational logic 290.

Additionally, in equation (2), h(t) represents the normalized impulse response of the analog filters 260, 270 and 280. Therefore, $\int h(t)dt = 1$ for each of the analog filters 260, 270 and 280. Furthermore, in equation (2)

$$I_A + I_B + I_C = I_O$$

and $$\text{CTRL\_A} + \text{CTRL\_B} + \text{CTRL\_C} = N = 2^m. \quad (3)$$

Let the binary equivalent of the m least significant bits of the digital control word CTRL (i.e., the m bits forming signal FINE_CONTROL) be n, and let the 2's complement of n be n'. Therefore, $$n = \text{mod}(\text{CTRL}, N),$$

and $$n' = N - n$$

Table I, shown below, lists for each of the sub-regions 0a through 5b, the corresponding 3 bits of the signal COARSE_SELECT and the most significant bit (MSB) of signal FINE_CONTROL (collectively shown in Table I as a 4-bit signal SELECT) for selecting from among the input phase signals, $\theta_0$, $\theta_{60}$, $\theta_{120}$, $\theta_{180}$, $\theta_{240}$ and $\theta_{300}$, applied to MUX 220; the phase of each of the selected phase signals $\theta_A$, $\theta_B$ and $\theta_C$, as well as the values of signals CTRL_A, CTRL_B and CTRL_C.

TABLE I

| Sub-region | SELECT | $\theta_A$ | $\theta_B$ | $\theta_C$ | CTRL_A | CTRL_B | CTRL_C |
|---|---|---|---|---|---|---|---|
| 0a | 0000 | $\theta_0$ | $\theta_{60}$ | $\theta_{300}$ | n' | n | 0 |
| 0b | 0001 | $\theta_0$ | $\theta_{60}$ | $\theta_{120}$ | n' | n | 0 |
| 1a | 0010 | $\theta_0$ | $\theta_{60}$ | $\theta_{120}$ | 0 | n' | n |
| 1b | 0011 | $\theta_{180}$ | $\theta_{60}$ | $\theta_{120}$ | 0 | n' | n |
| 2a | 0100 | $\theta_{180}$ | $\theta_{60}$ | $\theta_{120}$ | n | 0 | n' |
| 2b | 0101 | $\theta_{180}$ | $\theta_{240}$ | $\theta_{120}$ | n | 0 | n' |
| 3a | 0110 | $\theta_{180}$ | $\theta_{240}$ | $\theta_{120}$ | n' | n | 0 |
| 3a | 0111 | $\theta_{180}$ | $\theta_{240}$ | $\theta_{300}$ | n' | n | 0 |

TABLE I-continued

| Sub-region | SE-LECT | $\theta_A$ | $\theta_B$ | $\theta_C$ | CTRL_A | CTRL_B | CTRL_C |
|---|---|---|---|---|---|---|---|
| 4a | 1000 | $\theta_{180}$ | $\theta_{240}$ | $\theta_{300}$ | 0 | n' | n |
| 4b | 1001 | $\theta_0$ | $\theta_{240}$ | $\theta_{300}$ | 0 | n' | n |
| 5a | 1010 | $\theta_0$ | $\theta_{240}$ | $\theta_{300}$ | n | 0 | n' |
| 5b | 1011 | $\theta_0$ | $\theta_{60}$ | $\theta_{300}$ | n | 0 | n' |

Based on the above, if the phase is between 0 and 60 degrees, (i.e., between $\theta_0$ and $\theta_{60}$) signal CTRL is between 0 and N−1, and therefore, according to Table I:

$$CTRL\_A = n' = N - CTRL$$

$$CTRL\_B = n = CTRL$$

$$CTRL\_C = 0 \quad (3)$$

If the phase is between 60° and 120°, signal CTRL is between N and 2N−1, and, therefore:

$$CTRL\_A = 0$$

$$CTRL\_B = n' = 2N - CTRL$$

$$CTRL\_C = n = CTRL - N \quad (5)$$

According to table I, when the phase is between 0° and 60°, $\theta_A$ is equal to 0, $\theta_B$ is equal to $\pi/3$ and $\theta_C$ is equal to either $-\pi/3$ (region 0a) or to $2\pi/3$ (region 0b). After substituting equation (4) into equation (2) and substituting the resulting expression into equation (1), it is seen that:

$$\theta_{OUT} = \theta_{fix} + \frac{\pi}{3} \times \frac{CTRL}{N} \otimes h(t) \quad (6)$$

A similar results is achieved by substituting equation (5) into equation (2) and substituting the resulting expression into equation (1) if the phase is between 60° and 120°. Therefore, equation (6) is valid for all phases.

Therefore, as seen from equation (6), output phase signal $\theta_{OUT}$ is proportional to the convolution of the digital control word CTRL (except for the fixed term $\theta_{fix}$) and the unit sample response h(t) of the analog filters. To further aid in understanding some of the advantages of the present invention, we provide the following example, which refers to FIG. 7 and Table I.

Assume that the phase of phasor w lies between 0 and 30 degrees in region 0a, as shown in FIG. 7. Therefore, according to Table I, the phase of signal w is determined by phases $\theta_0$, $\theta_{60}$ and $\theta_{300}$. Note that phase $\theta_{300}$ has a 60° phase difference with respect to phase $\theta_0$ (i.e., $\theta_{300}$ is a nearest-neighbor phase to $\theta_0$). The weights applied to these phases for linear interpolation, i.e., CTRL_A, CTRL_B and CTRL_C are respectively equal to n', n and 0. In other words, the weight applied to phase $\theta_{300}$ is 0. As the phase moves from point w to point x (i.e., from region 0a to 0b), phase $\theta_{300}$ (the nearest-neighbor signal to signal $\theta_0$) is replaced with phase $\theta_{120}$ (the nearest signal to signal $\theta_{60}$), although the applied weight to phase $\theta_{120}$ (i.e., Ctrl_C) remains zero. Next, as the phase moves from point x in sub-region 0b to point y in sub-region 1a, (i.e., crosses the 60° phase), the same phases $\theta_0$, $\theta_{60}$ and $\theta_{120}$, are used for interpolation, although the weights applied thereto, namely control signals CTRL_A, CTRL_B and CTRL_C, are changed to 0, n' and n. Therefore, advantageously in accordance with the present invention, each output signal bit (i.e., $\theta_A$, $\theta_B$ or $\theta_C$) of MUX 220 may change only when the weight of the input signal applied to that output signal bit is zero, thus inhibiting glitches at the generated phase. For example, output signal bit $\theta_A$ may change only when weight signal $I_A$ is at zero.

Figure 8:
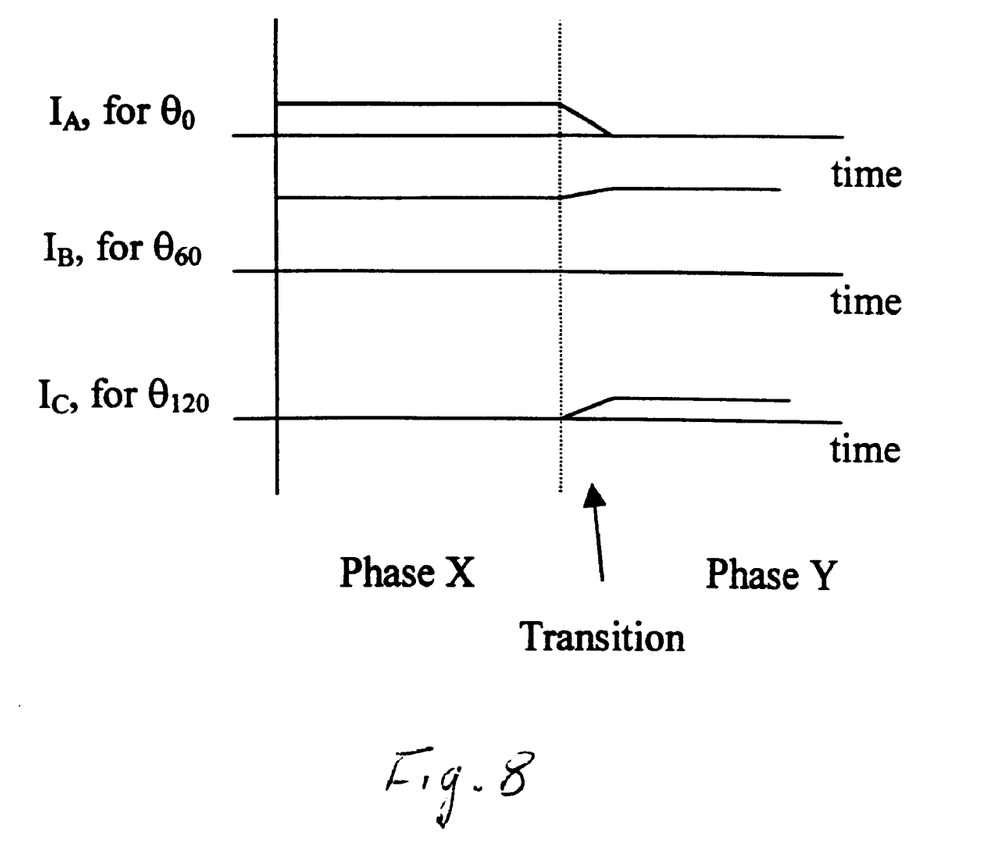
FIG. 8 shows a waveform of the input weight signals received by the linear phase interpolator of the three-way circular phase interpolator of FIG. 5 when the phase of the generated signal crosses a major phase.

FIG. 8 shows the transition in the value of weight signals $I_A$, $I_B$, and $I_C$, respectively applied to phase signals $\theta_0$, $\theta_{60}$ and $\theta_{120}$, as the phase of the generated signal moves from point x to point y. Due to the availability of the third input port, $\theta_{120}$ is not replaced with $\theta_0$. Both $\theta_{120}$ with $\theta_0$ are coupled to LPI 210 at the same time. Therefore, the output signal $\theta_{OUT}$ of three-way circular phase interpolator 200 does not have glitches. The availability of a third input port also allows a gradual disappearance of contribution from phase signal $\theta_0$, and a gradual contribution from phase $\theta_{120}$ by way of analog filtering. Advantageously, the present invention is not limited to the unitary update rule.

The analog filtering in the phase domain attenuates the out-of-band phase noises thus providing low output jitter.

The circular phase interpolator, in accordance with another embodiment of the present invention, uses phases available at four input ports to interpolate. FIG. 9 shows a phasor diagram which divides the $2\pi$ phase of the reference clock signal into eight phases of 0°, 45°, 90°, 135°, 1800, 225°, 270° and 315°.

Although in the description below of a four-way circular phase interpolator, the $2\pi$ phase is divided into 8 equal 45° phases, it is understood that the $2\pi$ phase may be divided into any integer number of phases (e.g. 10).

The associated control logic table of a four-way circular phase interpolator is shown in Table II below.

As seen from Table II, four phase signals $\theta_A$, $\theta_B$, $\theta_C$ and $\theta_D$ respectively receiving weights CTRL_A, CTRL_B, CTRL_C and CTRL_D are used for interpolation. Although four phases are included for interpolation, in a static condition (i.e., the control word is not changing), only the phases of two signals affect the interpolated result because the weights associated with the other two such phases are equal to 0. For example, in phase region 0, CTRL A and CTRL_D are set to 0 and, therefore, do not affect the linearly interpolated phase. Accordingly, in region 0, only phases $\theta_B$ and $\theta_C$ determine the phase of the generated signal.

| Phase region | signal COARSE_SELECT | $\theta_A$ | $\theta_B$ | $\theta_C$ | $\theta_D$ | CTRL_A | CTRL_B | CTRL_C | CTRL_D |
|---|---|---|---|---|---|---|---|---|---|
| 0 | 000 | $\theta_{315}$ | $\theta_0$ | $\theta_{45}$ | $\theta_{90}$ | 0 | n' | n | 0 |
| 1 | 001 | $\theta_{135}$ | $\theta_0$ | $\theta_{45}$ | $\theta_{90}$ | 0 | 0 | n' | n |
| 2 | 010 | $\theta_{135}$ | $\theta_{180}$ | $\theta_{45}$ | $\theta_{90}$ | n | 0 | 0 | n' |
| 3 | 011 | $\theta_{135}$ | $\theta_{180}$ | $\theta_{225}$ | $\theta_{90}$ | n' | n | 0 | 0 |

-continued

| Phase region | signal COARSE_SELECT | $\theta_A$ | $\theta_B$ | $\theta_C$ | $\theta_D$ | CTRL_A | CTRL_B | CTRL_C | CTRL_D |
|---|---|---|---|---|---|---|---|---|---|
| 4 | 100 | $\theta_{135}$ | $\theta_{180}$ | $\theta_{225}$ | $\theta_{270}$ | 0 | n' | n | 0 |
| 5 | 101 | $\theta_{315}$ | $\theta_{180}$ | $\theta_{225}$ | $\theta_{270}$ | 0 | 0 | n' | n |
| 6 | 110 | $\theta_{315}$ | $\theta_0$ | $\theta_{225}$ | $\theta_{270}$ | n | 0 | 0 | n' |
| 7 | 111 | $\theta_{315}$ | $\theta_0$ | $\theta_{45}$ | $\theta_{270}$ | n' | n | 0 | 0 |

The exemplary embodiments of the invention disclosed above are illustrative and not limiting. Other embodiments of this invention are possible within the scope of the appended claims.

The invention is not limited by the number of input ports used to receive signals for interpolation.

The invention is not limited by the number of major phases that divide the $2\pi$ phase; nor is it limited by the type of circuitry used to implement the interpolation.

I claim:

1. A circular phase interpolator for generating a clock having a phase and comprising:
    a multiplexer for receiving a plurality of signals representative of evenly spaced phases of a reference clock and in response thereto supplying at least three input phases;
    input ports for receiving the at least three input phases each phase being representative of a different one of the phases of the reference clock;
    input ports for receiving at least three input weight signals; and
    circuitry for applying each of the at least three input weight signals to a different one of the at least three input phases thereby forming a weighted sum of the at least three input phases, which sum represents the phase of the generated clock.

2. The circular phase interpolator of claim 1 further comprising at least three digital-to-analog signal converters each for receiving and converting to an analog signal a digital signal of each of the at least three input weight signals.

3. The circular phase interpolator of claim 2 further comprising at least three low-pass analog filters for respectively low-pass filtering a different one of the at least three converted analog signals.

4. The circular phase interpolator of claim 3 wherein said circuitry comprises a linear phase interpolator for forming the weighted sum.

5. The circular phase interpolator of claim 4 further comprising a combinational logic for receiving m bits and in response thereto supplying digital signals received by the at least three digital-to-analog signal converters.

6. The circular phase interpolator of claim 5 wherein said evenly spaced phases of the reference clock are respectively positioned at 0°, 60°, 120°, 180°, 240° and 300° of a 360° phase.

7. The circular phase interpolator of claim 6 wherein a first and a second input phase of the at least three input phases represent reference clock phases having 60° phase difference and wherein the second and a third input phase of the at least three input phases represent reference clock signal phases having 60° phase difference.

8. The circular phase interpolator of claim 7 wherein the input weight signal applied to the third input phase is zero.

9. The circular phase interpolator of claim 8 wherein as the interpolated phase moves from a region between 0° and 30° of the first and second input phases to a region between 30° and 60° of the first and second input phases, the third input phase changes from being 60° apart from one of the first and second input phases to being 60° apart from the other of the first and second input phases.

10. The circular phase interpolator of claim 9 wherein as the interpolated phase increases above the second phase or decreases below the first phase, the input weights are redistributed so that no glitch is generated at the linearly interpolated phase.

11. The circular phase interpolator of claim 10 wherein the weighted sum is a linear weighted sum of the at least three input phases.

12. The circular phase interpolator of claim 11 wherein the linearly interpolated phase is proportional to the convolution of the unit sample response of any one of the at least three analog filters and a digital word whose most significant bits are the signals applied to input select terminals of the multiplexer and whose least significant bits are the m bits applied to the combinational logic.

13. The circular phase interpolator of claim 1 wherein the weighted sum is a non-linear weighted sum of the at least three input phases.

14. A method for generating a clock having a phase, said method comprising:
    receiving a plurality of evenly spaced phases of a reference clock;
    receiving a plurality of control signals;
    choosing at least three input phases from the plurality of evenly spaced phases of the reference clock based on the control signals;
    supplying the at least three input phases;
    receiving the at least three input phases, each phase being representative of a different one of phases of the reference clock;
    receiving at least three input weight signals; and
    applying each of the at least three input weight signals to a different one of the at least three input phases thereby forming a weighted sum of the at least three input phases, which sum represents the phase of the generated clock.

15. The method of claim 14 further comprising converting each of the at least three weight signals from a digital signal to an analog signal.

16. The method of claim 15 further comprising low-pass filtering each of the at least three converted analog signals.

17. The method of claim 16 further comprising receiving m bits and in response thereto supplying digital signals for converting each of the at least three weight signals from a digital signal to an analog signal.

18. The method of claim 17 wherein the act of receiving a plurality of evenly spaced phases of the reference clock includes receiving evenly spaced phases 0°, 60°, 120°, 180°, 240° and 300° of the reference clock.

19. The method of claim 18 wherein the act of receiving the at least three input phases includes receiving first and second phases having 60° phase difference and receiving a third phase having 60° phase difference with respect to the second phase.

20. The method of claim 19 wherein a third input weight signal of the at least three input weight signals is zero.

21. The method of claim 20 wherein as the interpolated phase moves from a region between 0° and 30° of the received first and second input phases to a region between 30° and 60° of the received first and second input phases, the third input phase changes from being 60° apart from one of the first and second input phases to being 60° apart from the other of the first and second input phases.

22. The method of claim 21 wherein as the interpolated phase increases above the second phase or decreases below the first phase, the input weights are redistributed so that no glitch is generated at the interpolated phase.

23. The method of claim 14 wherein the weighted sum is a linear weighted sum of the at least three input phases.

24. The method of claim 14 wherein the weighted sum is a non-linear weighted sum of the at least three input phases.

* * * * *